United States Patent
Chang

(10) Patent No.: US 10,957,576 B2
(45) Date of Patent: Mar. 23, 2021

(54) DYNAMIC RANDOM ACCESS MEMORY AND METHOD OF FABRICATING THE SAME

(71) Applicant: Winbond Electronics Corp., Taichung (TW)

(72) Inventor: Feng-Jung Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 132 days.

(21) Appl. No.: 16/361,245

(22) Filed: Mar. 22, 2019

(65) Prior Publication Data

US 2020/0303240 A1  Sep. 24, 2020

(51) Int. Cl.
*H01L 21/762* (2006.01)
*H01L 27/108* (2006.01)

(52) U.S. Cl.
CPC .. *H01L 21/76224* (2013.01); *H01L 27/10805* (2013.01); *H01L 27/10891* (2013.01)

(58) Field of Classification Search
CPC ......... H01L 21/76224; H01L 27/10805; H01L 27/10891
See application file for complete search history.

(56) References Cited

U.S. PATENT DOCUMENTS

| | | | |
|---|---|---|---|
| 7,872,313 B2 | 1/2011 | Jung | |
| 8,865,547 B2 | 10/2014 | Kang | |
| 9,093,297 B2 | 7/2015 | Song et al. | |
| 9,269,720 B1 | 2/2016 | Bae et al. | |
| 10,062,613 B1* | 8/2018 | Chang | ............... H01L 27/10823 |
| 10,068,907 B1 | 9/2018 | Tsai et al. | |
| 2012/0091520 A1* | 4/2012 | Nakamura | ............... H01L 24/06 257/303 |
| 2012/0211813 A1* | 8/2012 | Taketani | ............. H01L 29/0847 257/296 |
| 2013/0062679 A1* | 3/2013 | Manabe | ............. H01L 29/4236 257/306 |
| 2013/0196477 A1* | 8/2013 | Kang | ................ H01L 21/28017 438/270 |
| 2015/0194438 A1 | 7/2015 | Kim et al. | |
| 2018/0025947 A1 | 1/2018 | Hwang et al. | |

* cited by examiner

*Primary Examiner* — Fernando L Toledo
*Assistant Examiner* — Neil R Prasad
(74) *Attorney, Agent, or Firm* — JCIPRNET

(57) ABSTRACT

A dynamic random access memory (DRAM) and a method of fabricating the same are provided. The DRAM includes a substrate, a plurality of first isolation structures, a plurality of word line structures, a plurality of second isolation structures, and a plurality of third isolation structures. The plurality of first isolation structures are located in the substrate to define a plurality of active areas arranged along a first direction, wherein the plurality of active areas and the plurality of first isolation structures are alternately arranged along the first direction. The plurality of word line structures pass through the plurality of active areas and the plurality of first isolation structures. The plurality of word line structures are arranged along a second direction and extended along a third direction. The plurality of second isolation structures are located in the substrate where the plurality of word line structures are interleaved with the plurality of active areas and located between the two adjacent first isolation structures. The plurality of third isolation structures cover the plurality of word line structures.

17 Claims, 24 Drawing Sheets

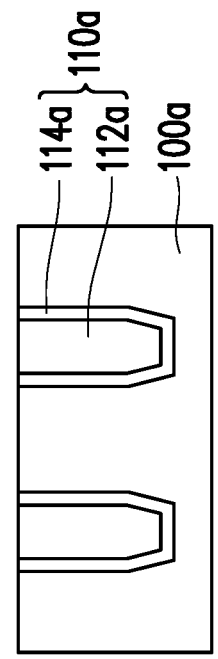
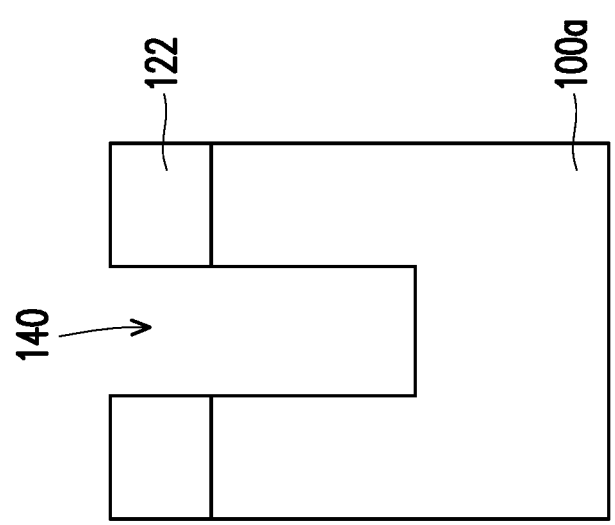
FIG. 2C
FIG. 2B

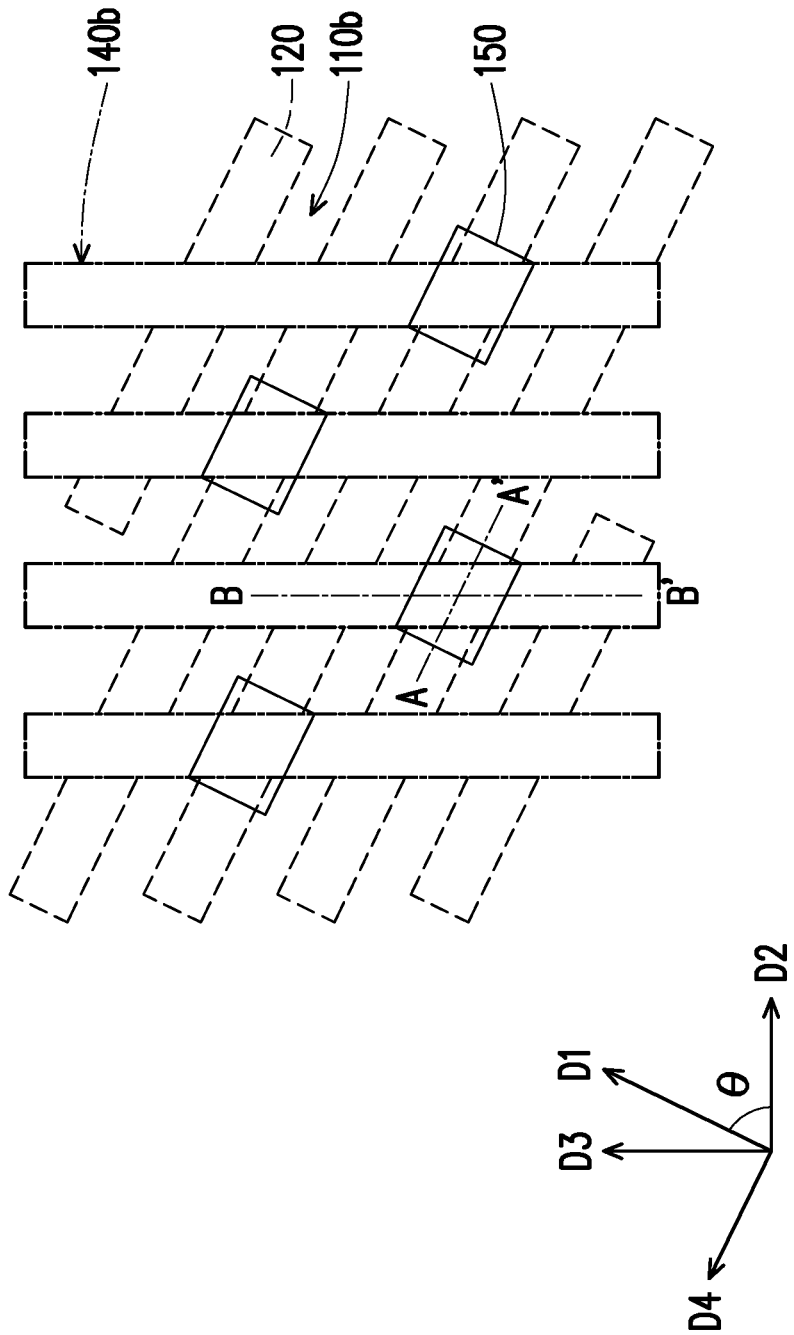

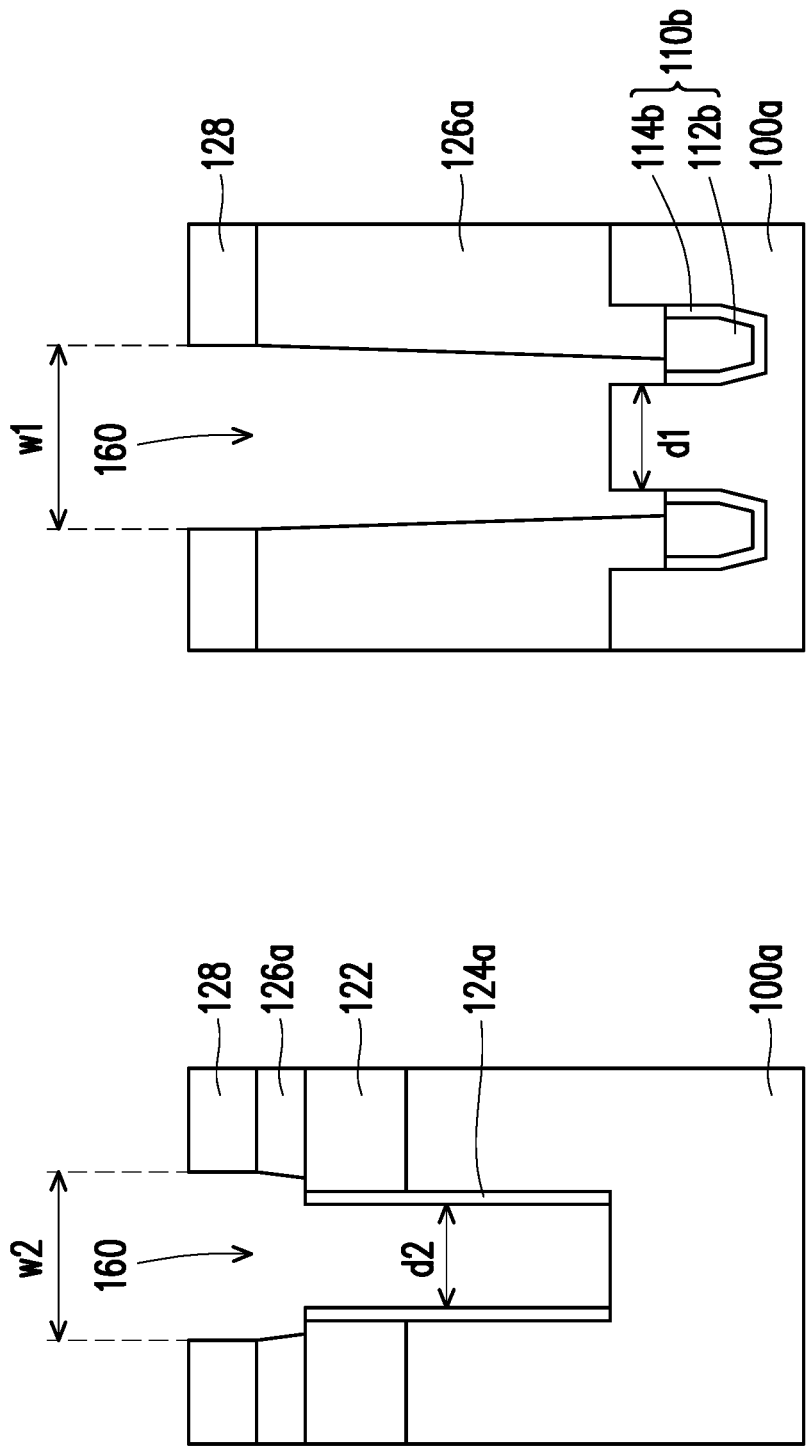

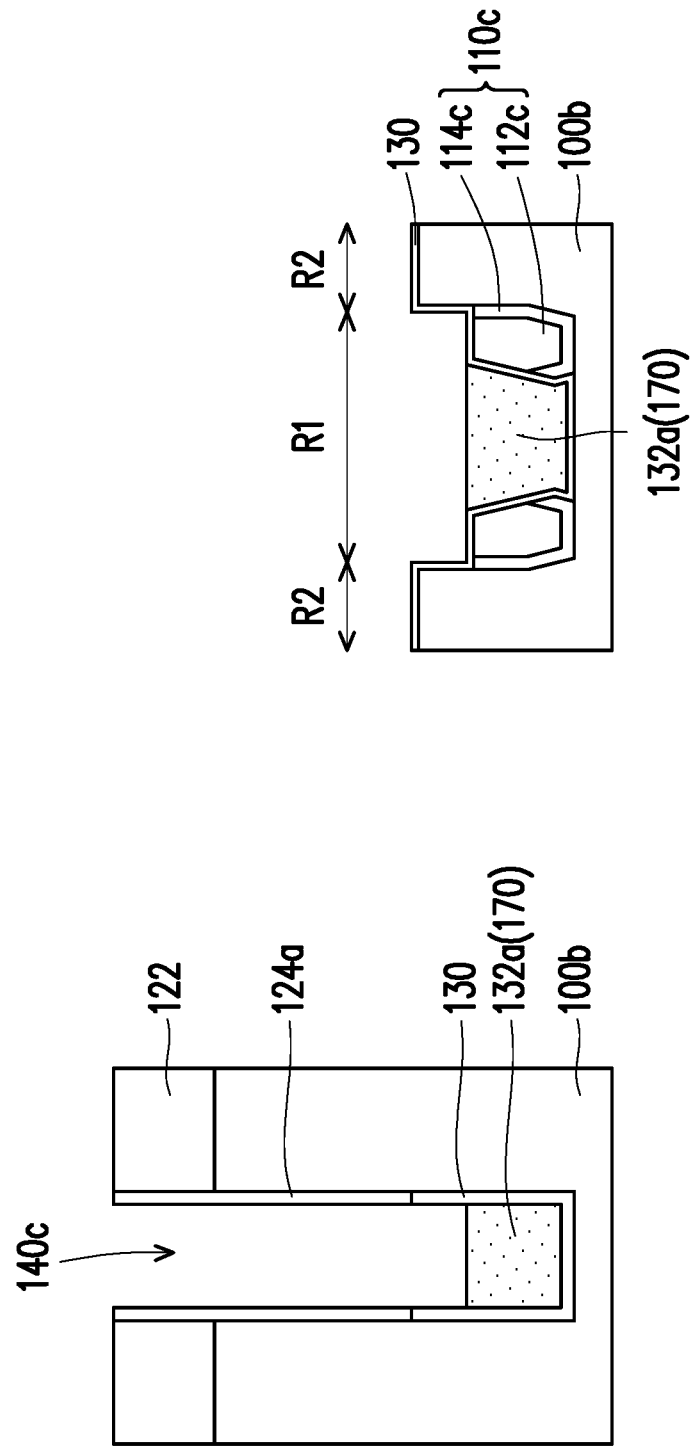

DYNAMIC RANDOM ACCESS MEMORY AND METHOD OF FABRICATING THE SAME

BACKGROUND OF THE INVENTION

Field of the Invention

The invention relates to a memory and a method of fabricating the same, and particularly relates to a dynamic random access memory (DRAM) and a method of fabricating the same.

Description of Related Art

A dynamic random access memory (DRAM) belongs to a kind of volatile memory, which is composed of a plurality of memory cells. Specifically, each memory cell is mainly composed of a transistor and a capacitor controlled by the transistor, and each of the memory cells is electrically connected to each other by a word line and a bit line. In order to improve the integration of the dynamic random access memory to speed up the operation speed of components, and meet the consumer demands for small-scale electronic devices, buried word line dynamic random access memory (buried word line DRAM) has been developed in recent years to meet the above various needs.

In the prior art, active areas and an isolation area between the active areas are generally defined by forming a shallow trench isolation structure. In the existing technology, a buried word line is usually disposed passing through the isolation area. In the case where the integration of the memory is increased and the component size is reduced, increasing an area of the isolation area can reduce the problem of overlay shift between the bit line and the isolation area, but the larger area of the isolation area will limit an area of the active area, resulting in a reduction in a contact area between the active area and a capacitor contact window. When the contact area between the active area and the capacitor contact window becomes smaller, the resistance between the active area and the capacitor contact window will increase, and thereby reducing the reliability of the product. Therefore, how to develop a dynamic random access memory and a method of fabricating the same which can avoid the problem of overlay shift between the bit line and the isolation area while maintaining the contact area between the active area and the capacitor contact window will become an important topic.

SUMMARY OF THE INVENTION

The invention provides a dynamic random access memory, which can avoid the problem of overlay shift between a bit line and an isolation area while maintaining a contact area between an active area and a capacitor contact window, and thereby improving the reliability of the product.

The invention also provides a method of fabricating a dynamic random access memory, which can define the positions of a word line structure and an isolation area simultaneously. Not only the problem of overlay shift between the bit line and the isolation area can be avoided, but the cost of the overall process can be reduced as the number of photomasks required for the process is reduced.

The invention provides a dynamic random access memory including a substrate, a plurality of first isolation structures, a plurality of word line structures, a plurality of second isolation structures, and a plurality of third isolation structures. The plurality of first isolation structures are located in the substrate to define a plurality of active areas arranged along a first direction, wherein the plurality of active areas and the plurality of first isolation structures are alternately arranged along the first direction. The plurality of word line structures pass through the plurality of active areas and the plurality of first isolation structures. The plurality of word line structures are arranged along a second direction and extended along a third direction, wherein the second direction is perpendicular to the third direction, and the first direction intersects the second direction by an angle. The plurality of second isolation structures are located in the substrate where the plurality of word line structures are interleaved with the plurality of active areas and located between the two adjacent first isolation structures. The plurality of third isolation structures cover the plurality of word line structures.

The invention provides a method of fabricating a dynamic random access memory including the following steps. A plurality of first isolation structures are formed in a substrate to define a plurality of active areas arranged along a first direction, wherein the plurality of active areas and the plurality of first isolation structures are alternately arranged along the first direction. A portion of the plurality of first isolation structures and a portion of the substrate of the plurality of active areas are removed to form a plurality of trenches arranged along a second direction and extended along a third direction, wherein the second direction is perpendicular to the third direction, and the first direction intersects the second direction by an angle. A portion of the plurality of first isolation structures is removed to form a plurality of first openings in the plurality of trenches. A portion of the substrate where the plurality of active areas are interleaved with the plurality of trenches is removed to form a plurality of second openings, wherein the second opening is located between the two adjacent first isolation structures, and a bottom surface of the plurality of second openings is lower than a bottom surface of the plurality of first openings. A plurality of second isolation structures are formed in the plurality of second openings to fill the plurality of second openings. A plurality of word line structures are formed in the plurality of trenches. A plurality of third isolation structures are formed to cover the plurality of word line structures and fill the plurality of trenches.

Based on the above, in the dynamic random access memory of the invention, in the process of defining the word line structure, the positions of the second isolation structure and the third isolation structure in the isolation area can be simultaneously defined. Thus, the problem of overlay shift between the second isolation structure and the third isolation structure in the isolation area and the word line structure can be avoided. Thereby, the problem of abnormal refresh of the dynamic random access memory can be avoided. At the same time, the dynamic random access memory prepared by the process may have a narrower isolation area while maintaining a wider capacitor contact window, so as to achieve a lower capacitor contact window impedance and a higher memory cell transistor (Tr) channel starting current. Thereby, the dynamic random access memory may have better data read and write performance. On the other hand, since the number of photomasks required for the process is reduced, the cost of the overall process can also be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 12A are schematic top views of a manufacturing process of a dynamic random access memory according to an embodiment of the invention.

FIG. 1B to FIG. 12B are schematic cross-sectional views taken along a line A-A' of FIG. 1A to FIG. 12A respectively.

FIG. 1C to FIG. 12C are schematic cross-sectional views taken along a line B-B' of FIG. 1A to FIG. 12A respectively.

DESCRIPTION OF THE EMBODIMENTS

Figure 1A:
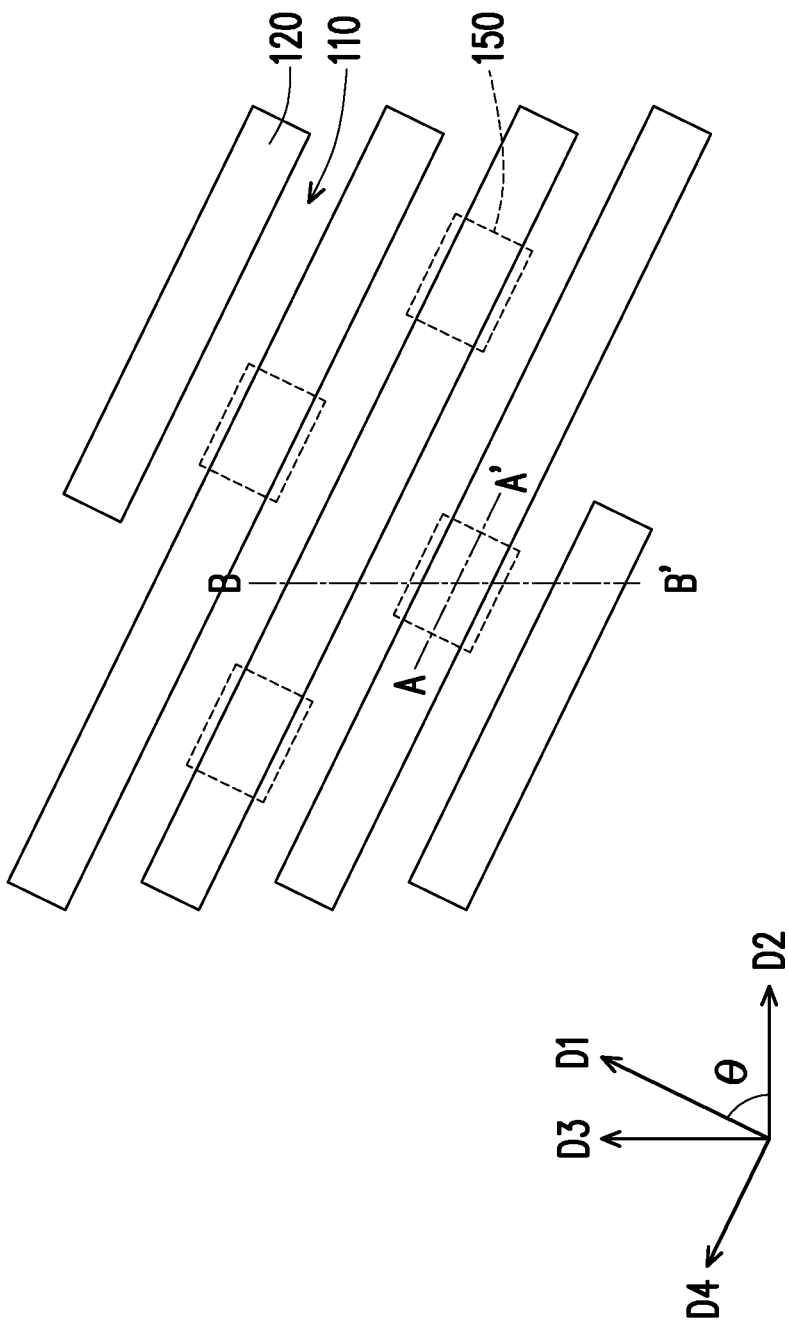

The invention will be more fully described with reference to the drawings of the embodiments. However, the invention may be embodied in a variety of different forms and should not be limited to the embodiments described herein. The thickness of layers and regions in the drawings will be exaggerated for clarity. The same or similar reference numerals indicate the same or similar elements, and the following paragraphs will not be repeated.

FIG. 1A to FIG. 12A are schematic top views of a manufacturing process of a dynamic random access memory according to an embodiment of the invention. FIG. 1B to FIG. 12B are schematic cross-sectional views taken along a line A-A' of FIG. 1A to FIG. 12A respectively. FIG. 1C to FIG. 12C are schematic cross-sectional views taken along a line B-B' of FIG. 1A to FIG. 12A respectively.

Figure 1C:
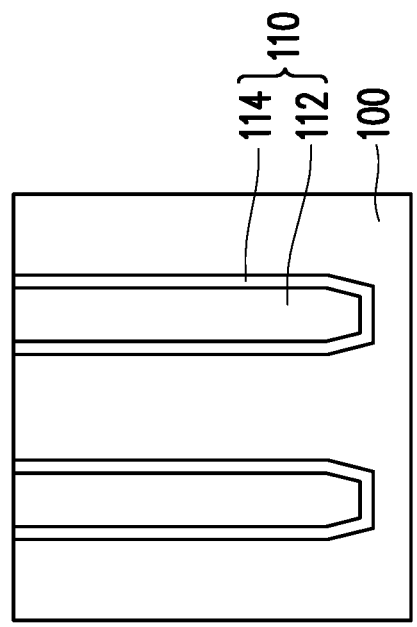
Figure 1B:
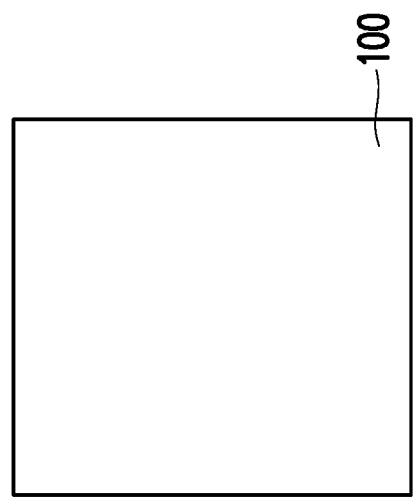
Figure 2A:
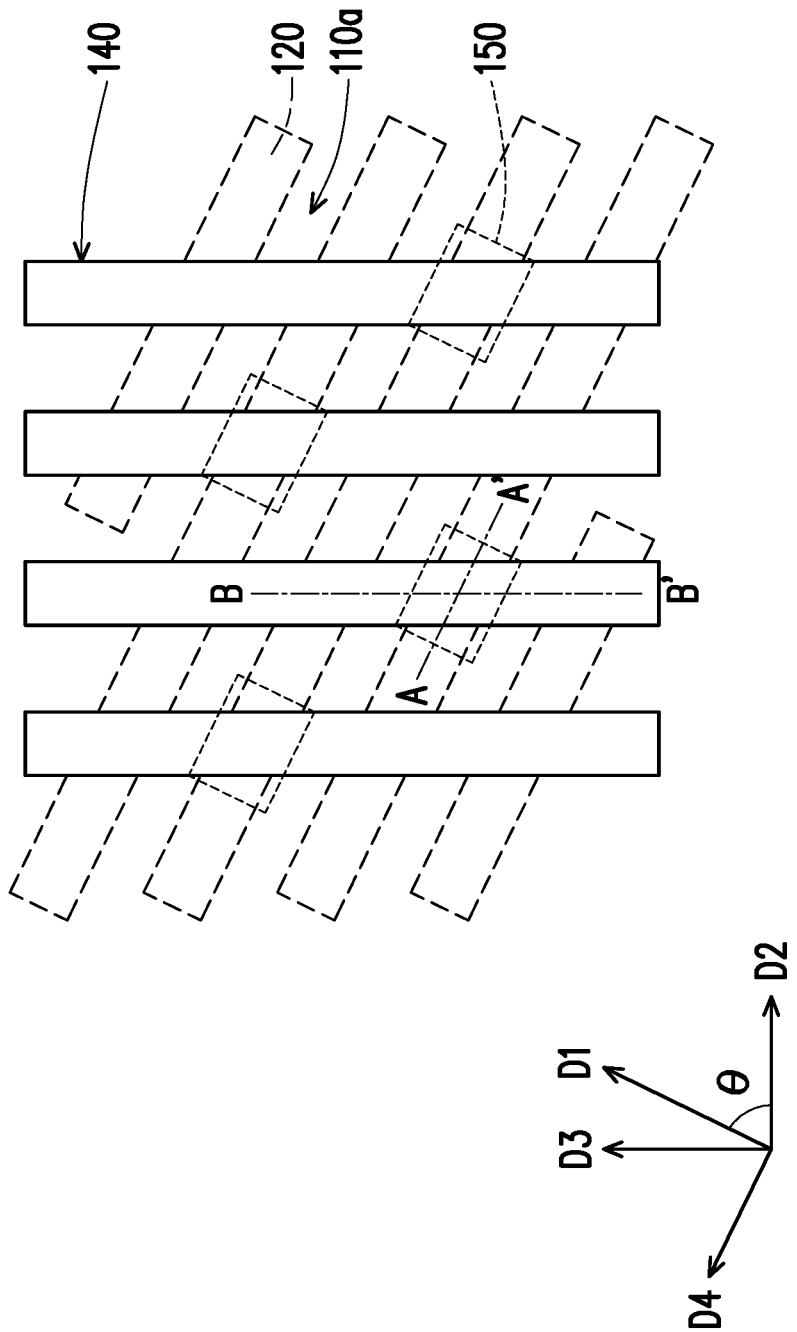

Referring to FIG. 1A to FIG. 1C, the embodiment provides a method of fabricating a dynamic random access memory including the following steps. First, a plurality of first isolation structures 110 are formed in a substrate 100 to define a plurality of active areas 120 arranged along a first direction D1. The plurality of active areas 120 and the plurality of first isolation structures 110 are alternately arranged along the first direction D1. In some embodiments, the substrate 100 may be a semiconductor substrate, a semiconductor compound substrate, or a semiconductor over insulator (SOD, for example. In some embodiments, a method of forming the plurality of first isolation structures 110 in the substrate 100 is photolithography etching, for example, but the invention is not limited thereto. In some embodiments, the step of forming the plurality of first isolation structures 110 in the substrate 100 is, for example, forming a hard mask layer on the substrate first. The hard mask layer is used as a mask to remove a portion of the substrate, so as to form a plurality of trenches in the substrate, wherein the plurality of trenches are arranged along the first direction D1. Then, a dielectric material is filled in the plurality of trenches to form the plurality of first isolation structures 110 in the substrate 100. In the present embodiment, the first isolation structure 110 includes a silicon nitride layer 112 and a silicon oxide layer 114, for example. The silicon oxide layer 114 is conformally formed in the trench to cover sidewalls and a bottom surface of the trench, for example. The silicon nitride layer 112 is formed on an inner surface of the silicon oxide layer 114 and fills the trench, for example, but the invention is not limited thereto. The first isolation structures 110 separate the substrate 100 into a plurality of strip patterns, and the strip patterns represent active areas 120 (as shown in FIG. 1A). At this point, the first isolation structures 110 and the active areas 120 are formed. In some embodiments, a depth of the first isolation structures 110 is, for example, between 250 nm and 330 nm, such as about 300 nm, but the invention is not limited thereto. In some embodiments, the first isolation structure 110 is a shallow trench isolation (STI) structure, for example, but the invention is not limited thereto. In some embodiments, the first direction D1 is non-orthogonal to and intersects an X-axis by an angle, for example. In the present embodiment, the first direction D1 intersects the X-axis by an angle θ, for example, wherein the angle θ is between 15 degrees and 25 degrees, for example, but the invention is not limited thereto. Referring to FIG. 1A, a dashed line box in the figure is referred to as a predetermined area for subsequent formation of an isolation area 150, which will be described in detail later.

Then, referring to FIG. 1A to FIG. 2C, a portion of the plurality of first isolation structures 110 and a portion of the substrate 110 of the plurality of active areas 120 are removed to form a plurality of trenches 140 arranged along a second direction D2 and extended along a third direction D3. In some embodiments, a method of forming the plurality of trenches 140 is photolithography etching, for example, but the invention is not limited thereto. In some embodiments, the step of forming the plurality of trenches 140 is, for example, forming a patterned mask 122 on the substrate 100. A method of forming the patterned mask 122 is photolithography etching, for example, but the invention is not limited thereto. Then, the patterned mask 122 is used as a mask to perform an etching process. The portion of the plurality of first isolation structures 110 and the portion of the substrate 110 of the plurality of active areas 120 are removed to form the plurality of trenches 140. In this step, the substrate 110 and the silicon nitride layer 112 and the silicon oxide layer 114 of the first isolation structure 110 are simultaneously removed, for example. In some embodiments, the second direction D2 is perpendicular to the third direction D3, for example, and the first direction D1 is non-orthogonal to and intersects the second direction D2 by an angle, for example. In the present embodiment, the second direction D2 is parallel to the X-axis, for example. The third direction D3 is parallel to a Y-axis, for example. The first direction D1 intersects the second direction D2 by an angle θ, for example, wherein the angle θ is between 65 degrees and 75 degrees, for example, but the invention is not limited thereto. That is, in the present embodiment, the plurality of trenches 140 are arranged along the X-axis and extended along the Y-axis, but the invention is not limited thereto. In some embodiments, a material of the patterned mask 122 is silicon oxide, for example, but the invention is not limited thereto. In the present embodiment, after the plurality of trenches 140 are formed, the subsequent processes are directly performed, and the patterned mask 122 is not removed. In the present embodiment, the plurality of trenches 140 are the predetermined positions for subsequent formation of word line structures, for example, which will be described in detail later.

Figure 3A:
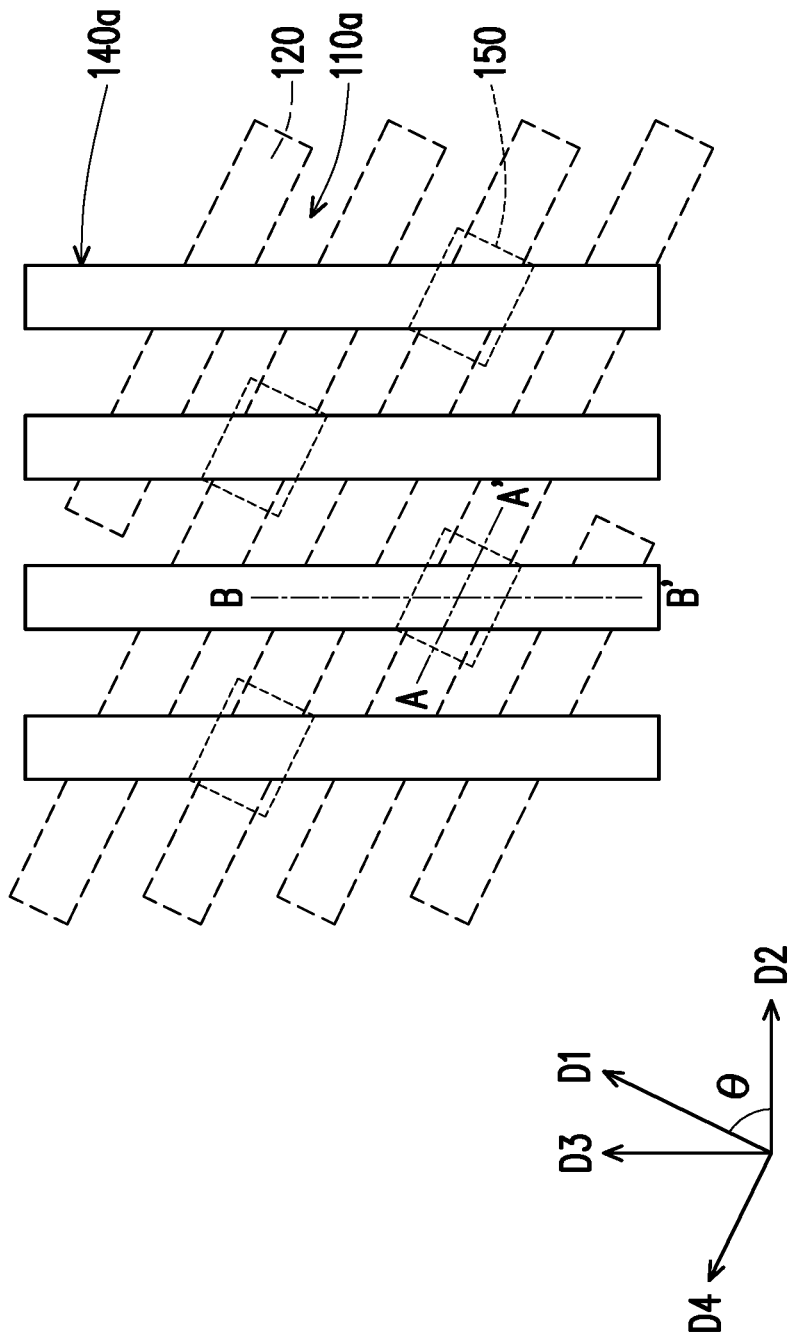
Figure 3B:
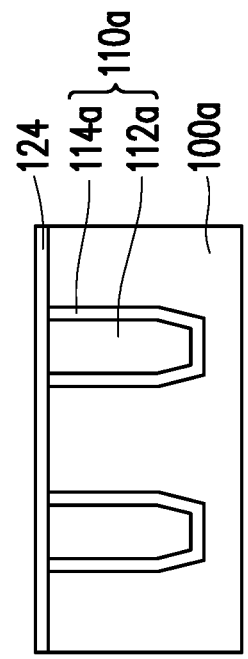
Figure 3C:
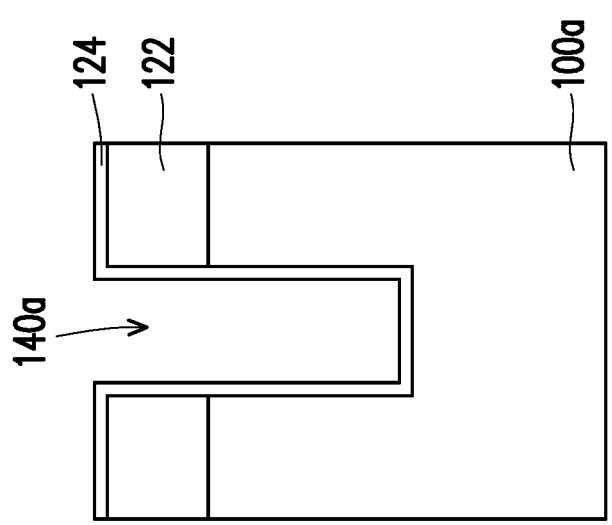
Figure 4A:
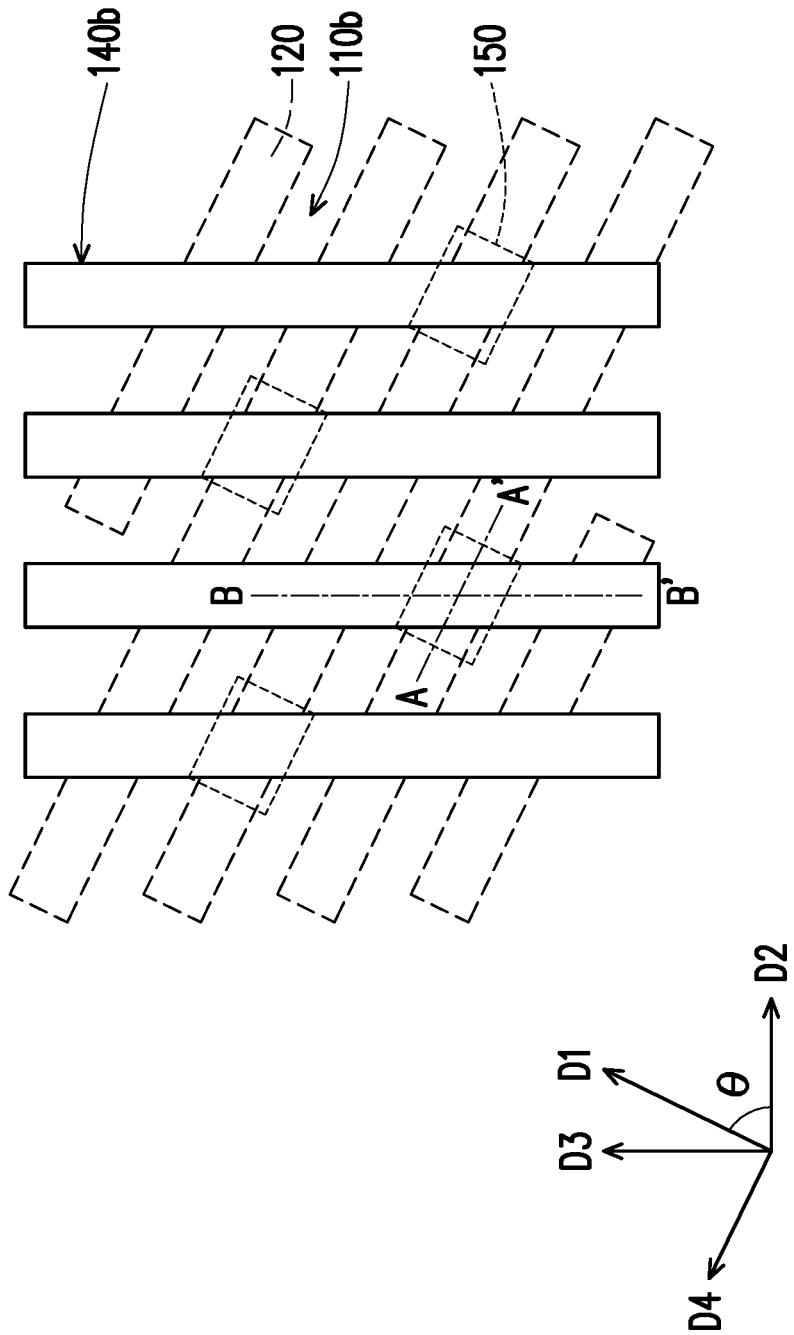
Figure 4C:
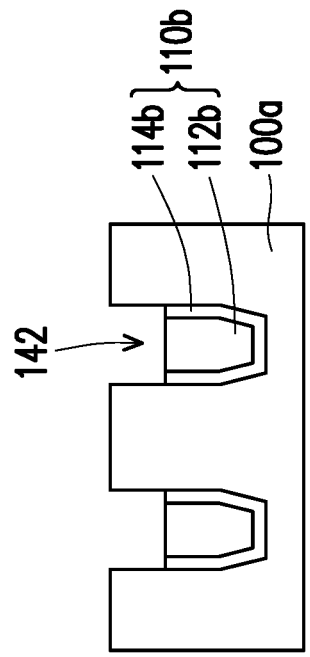
Figure 4B:
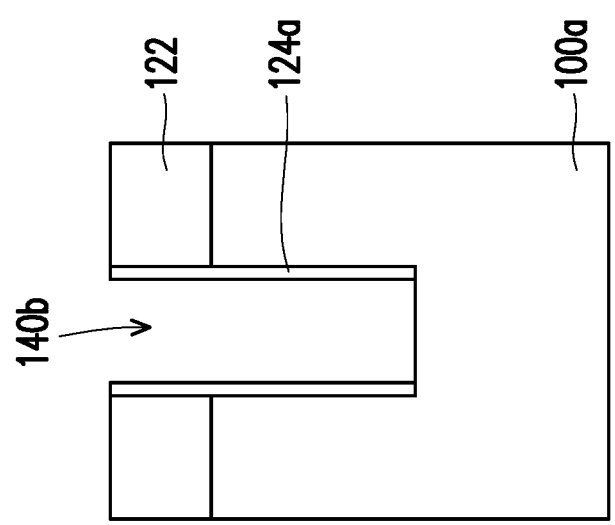

Then, referring to FIG. 2A to FIG. 3C, a silicon oxide layer 124 is formed. The silicon oxide layer 124 conformally covers surfaces of the trenches 140 and the patterned mask 122. As shown in FIG. 3C, in a trench 140a, the silicon oxide layer 124 covers upper surfaces of a substrate 100a and a first isolation structure 110a (including a silicon nitride layer 112a and silicon oxide layer 114a). In some embodiments, a method of forming the silicon oxide layer 124 is a chemical vapor deposition method, a physical vapor deposition method, or a spin coating method, for example, but the invention is not limited thereto.

Then, referring to FIG. 3A to FIG. 4C, a portion of the silicon oxide layer 124 and a portion of the plurality of first isolation structures 110a are removed to form a plurality of first openings 142 in the trenches 140a. In some embodiments, removing the portion of the silicon oxide layer 124 is removing the silicon oxide layer 124 located on a top surface of the patterned mask 122 and on a bottom surface of the trenches 140a, for example, and the remaining silicon oxide layer 124a is located on sidewalls of trenches 140b. In the present embodiment, in this step, it further includes removing a portion of the first isolation structures 110a located under the bottom surface of the trenches 140a. Thus, a top surface of the remaining first isolation structure 110b (including a silicon nitride layer 112b and a silicon oxide layer 114b) is lower than a top surface of the substrate 100a. At this time, the bottom surface of the trench 140b forms a saddle fin shape, which can be used for the configuration of the subsequent formation of a cell transistor. In some embodiments, a method of removing the portion of the silicon oxide layer 124 and the portion of the plurality of first isolation structures 110a is an etch back method, for example, but the invention is not limited thereto.

Then, referring to FIG. 4A to FIG. 8C, a portion of the substrate 100a where the plurality of active areas 120 are interleaved with the plurality of trenches 140 is removed to form a plurality of second openings 160b. The second opening 160b is located between two adjacent first isolation structures 110c, and a bottom surface of the plurality of second openings 160b is lower than a bottom surface of the plurality of first openings 142. The detailed steps are described below.

Figure 5A:
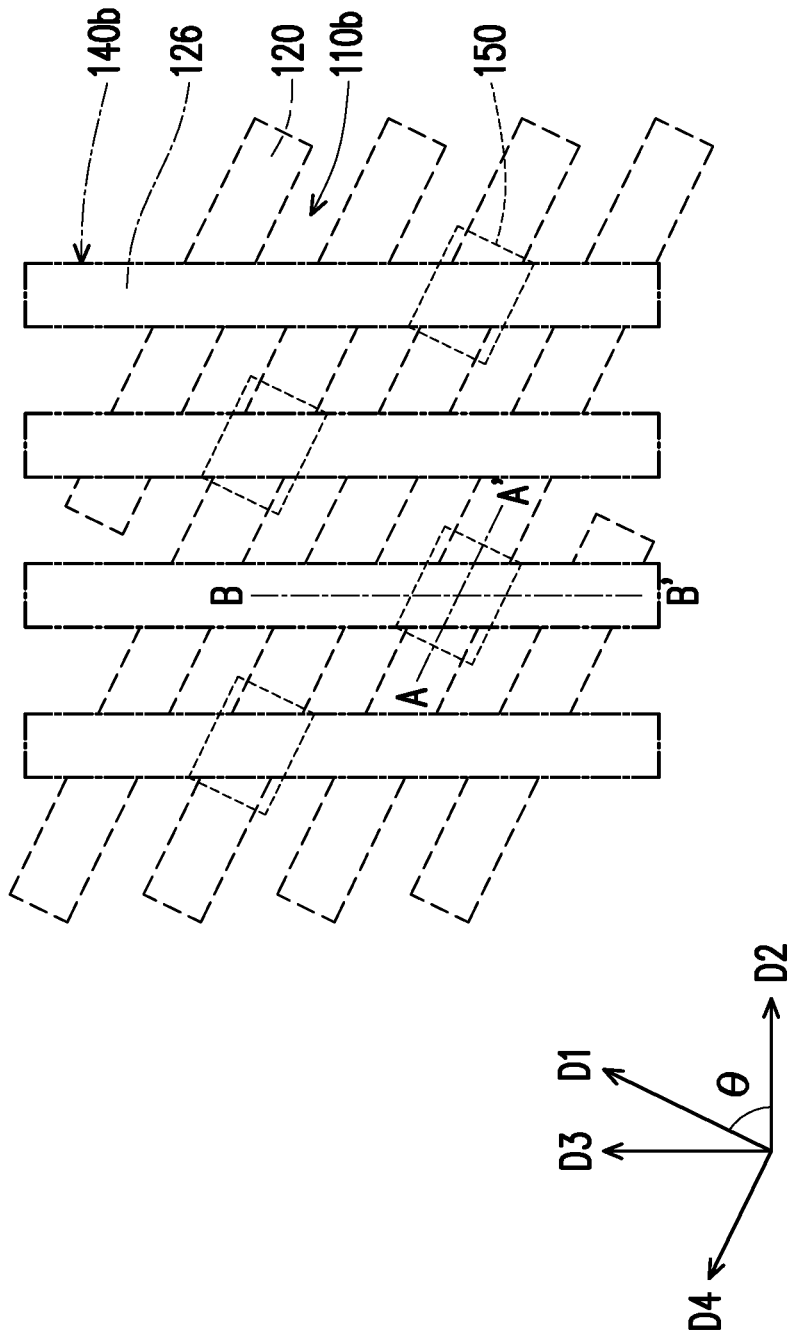
Figure 5C:
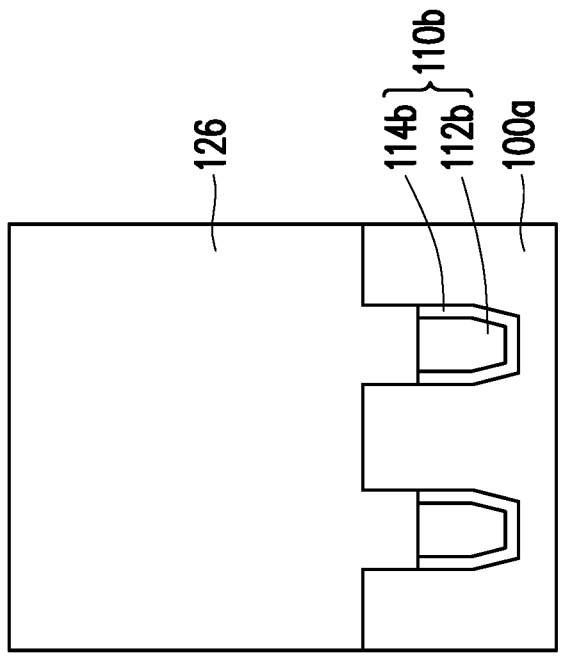
Figure 5B:
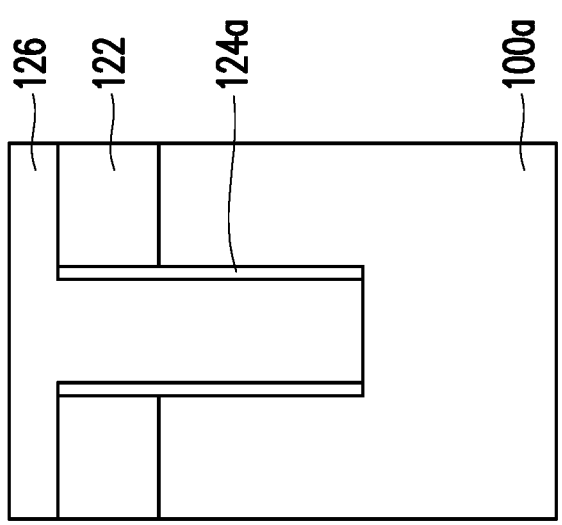

First, referring to FIG. 4A to FIG. 5C, a bottom anti-reflective coating (BARC) 126 is formed. The bottom anti-reflective coating 126 fills the trenches 140b and covers a top surface of the patterned mask 122. As shown in FIG. 5C, in the trench 140b, the bottom anti-reflective coating 126 covers surfaces of the substrate 100a and the first isolation structure 110b. In some embodiments, a method of forming the bottom anti-reflective coating 126 is a chemical vapor deposition method, a physical vapor deposition method, or a spin coating method, for example, but the invention is not limited thereto. In some embodiments, a material of the bottom anti-reflective coating 126 includes silicon nitride, silicon oxynitride, or a combination thereof, for example, but the invention is not limited thereto.

Then, referring to FIG. 5A to FIG. 6C, a photoresist layer 128 is formed on the bottom anti-reflective coating 126. The photoresist layer 128 is used to define the predetermined area of the isolation area 150. That is, the photoresist layer 128 covers a top surface of the bottom anti-reflective coating 126, and only exposes the solid line box area in FIG. 6A which represents the predetermined forming area of the isolation area 150. Then, the photoresist layer 128 is used as a mask to remove the exposed bottom anti-reflective coating 126, so as to form a second opening 160 in the isolation area 150. In some embodiments, a width w1 of the second opening 160 in the third direction D3 is greater than or equal to a distance d1 between the two first isolation structures 110b, for example. As shown in FIG. 6A and FIG. 6C, in the present embodiment, the width w1 of the second opening 160 in the third direction D3 is slightly greater than the distance d1 between the two first isolation structures 110b, for example. Thus, after the exposed bottom anti-reflective coating 126 is removed using the photoresist layer 128 as a mask, the second opening 160 exposes top surfaces of a portion of the substrate 100a and a portion the first isolation structure 110b (including the silicon nitride layer 112b and the silicon oxide layer 114b), but the invention is not limited thereto. In other embodiments, the width w1 of the second opening 160 in the third direction D3 may be equal to the distance d1 between the two first isolation structures 110b, for example. In this case, the second opening 160 only exposes the top surface of the portion of the substrate 100a. In addition, as shown in FIG. 6A and FIG. 6B, in the present embodiment, a width w2 of the second opening 160 in a fourth direction D4 is slightly greater than a distance d2 of the trench 140b in the fourth direction D4, for example, wherein the fourth direction D4 is perpendicular to the first direction D1, for example. Thus, after the exposed bottom anti-reflective coating 126 is removed using the photoresist layer 128 as a mask, the second opening 160 exposes a top surface of a portion of the substrate 100a, sidewalls and a top surface of a portion of the silicon oxide layer 124a, and a top surface of a portion of the patterned mask 122, but the invention is not limited thereto.

Figure 7A:
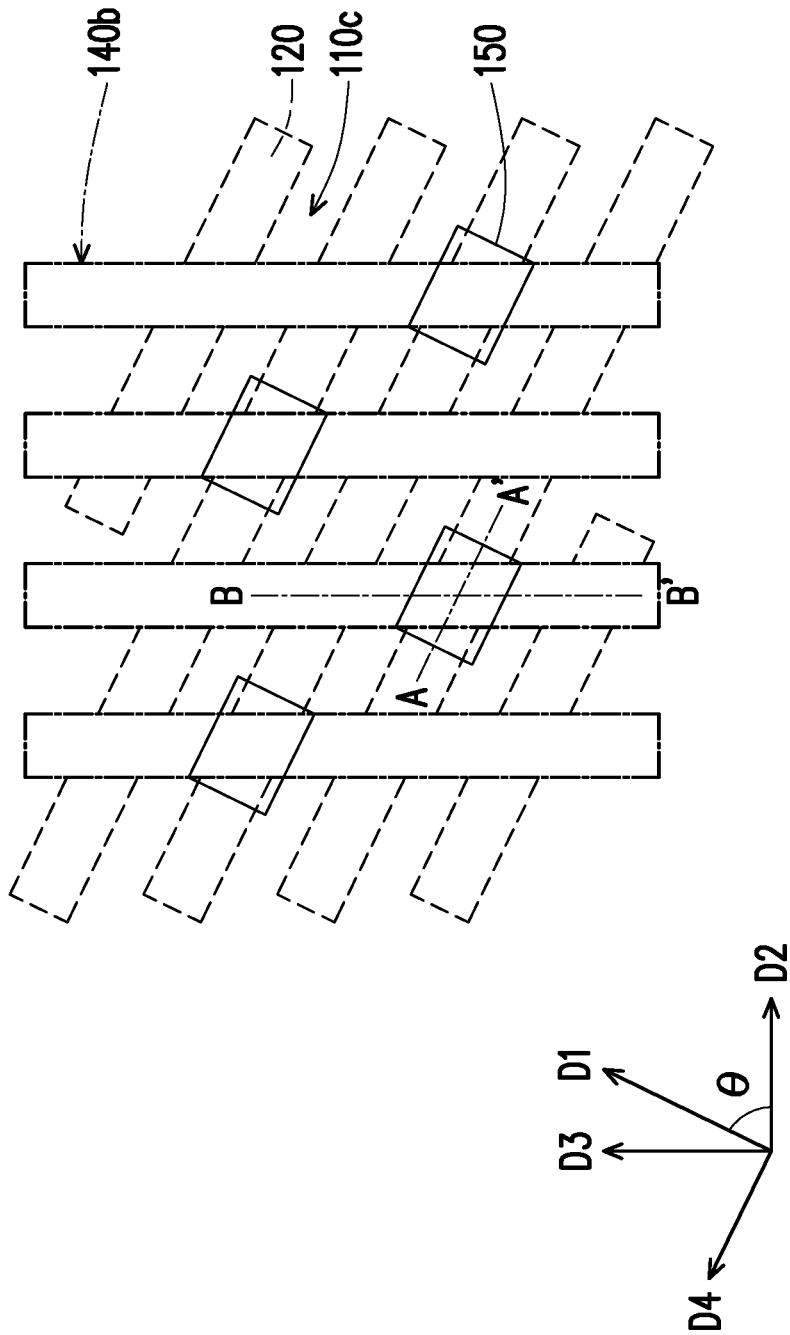
Figures 7B, 7C:
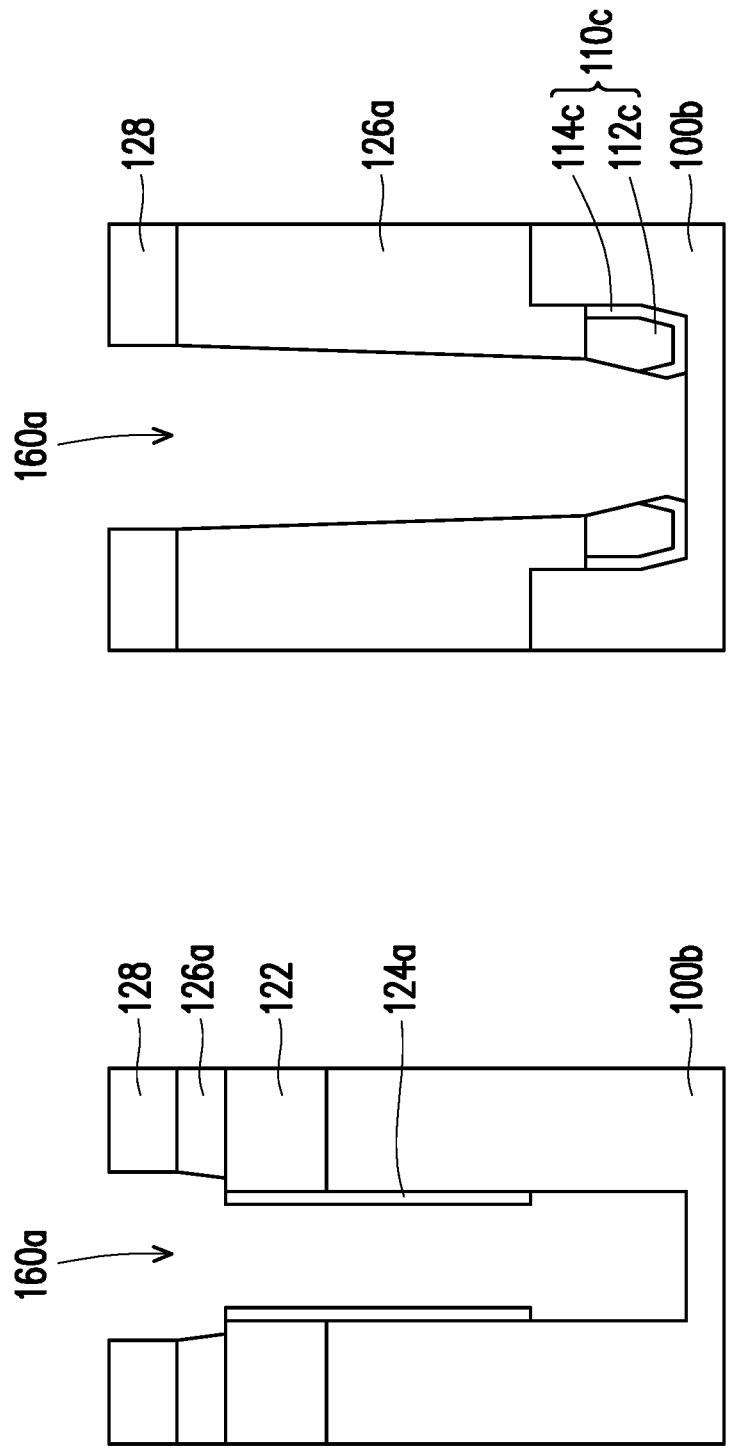

Then, referring to FIG. 6A to FIG. 7C, the exposed portion of the substrate 100a and the portion of the first isolation structure 110b are removed continuing using the photoresist layer 128 as a mask to form a second opening 160a. In some embodiments, a bottom surface of the second opening 160a is coplanar with a bottom surface of a first isolation structure 110c, for example. In other embodiments, the bottom surface of the second opening 160a is lower than the bottom surface of the first isolation structure 110c, for example. In some embodiments, a method of forming the second opening 160a is an etching method, for example. For instance, the etching method is anisotropic etching, isotropic etching, or a combination thereof, for example. In the present embodiment, the etching method may be a combination of anisotropic plasma etching and isotropic plasma etching, or may be a combination of anisotropic plasma etching and wet etching, but the invention is not limited thereto. In the present embodiment, the second opening 160 exposes top surfaces of a portion of the substrate 100a and a portion of the first isolation structure 110b (as shown in FIG. 6C). Thus, after the exposed portion of the substrate 100a and the portion of the first isolation structure 110b are removed continuing using the photoresist layer 128 as a mask, the second opening 160a exposes a top surface of a portion of the substrate 100b and sidewalls of a portion the first isolation structure 110c (including a silicon nitride layer 112c and a silicon oxide layer 114c) (as shown in FIG. 7C). It should be noted that, in the present embodiment, the step may include removing a portion of the substrate 100a and a portion of the silicon nitride layer 112b and a portion of the silicon oxide layer 114b of the first isolation structure 110b, for example. In other embodiments, the step may also include removing a portion of the substrate 100a and a portion of the silicon oxide layer 114b of the first isolation structure 110b, for example. Alternatively, in other embodiments, the step may only remove a portion of the substrate 100a. In other words, the portion removed by this step depends on the relationship between the width w1 of the second opening 160 in the third direction D3 and the distance d1 between the two first isolation structures 110b, in the present embodiment, in the second opening 160a, as long as no substrate exists between the two remaining adjacent first isolation structures 110c. That is to say, there is no substrate between the second isolation structure formed in the subsequent step and the first isolation structure 110c, which will be described in detail later. As shown in FIG. 7B, in the present embodiment, after the exposed portion of the substrate 100a is removed continuing using the photoresist layer 128 as a mask, the second opening 160a exposes sidewalls and a bottom surface of a portion of the substrate 100b, sidewalls and a top surface of a portion of the silicon oxide layer 124a, and a top surface of a portion of the patterned mask 122, but the invention is not limited thereto.

Figure 8A:
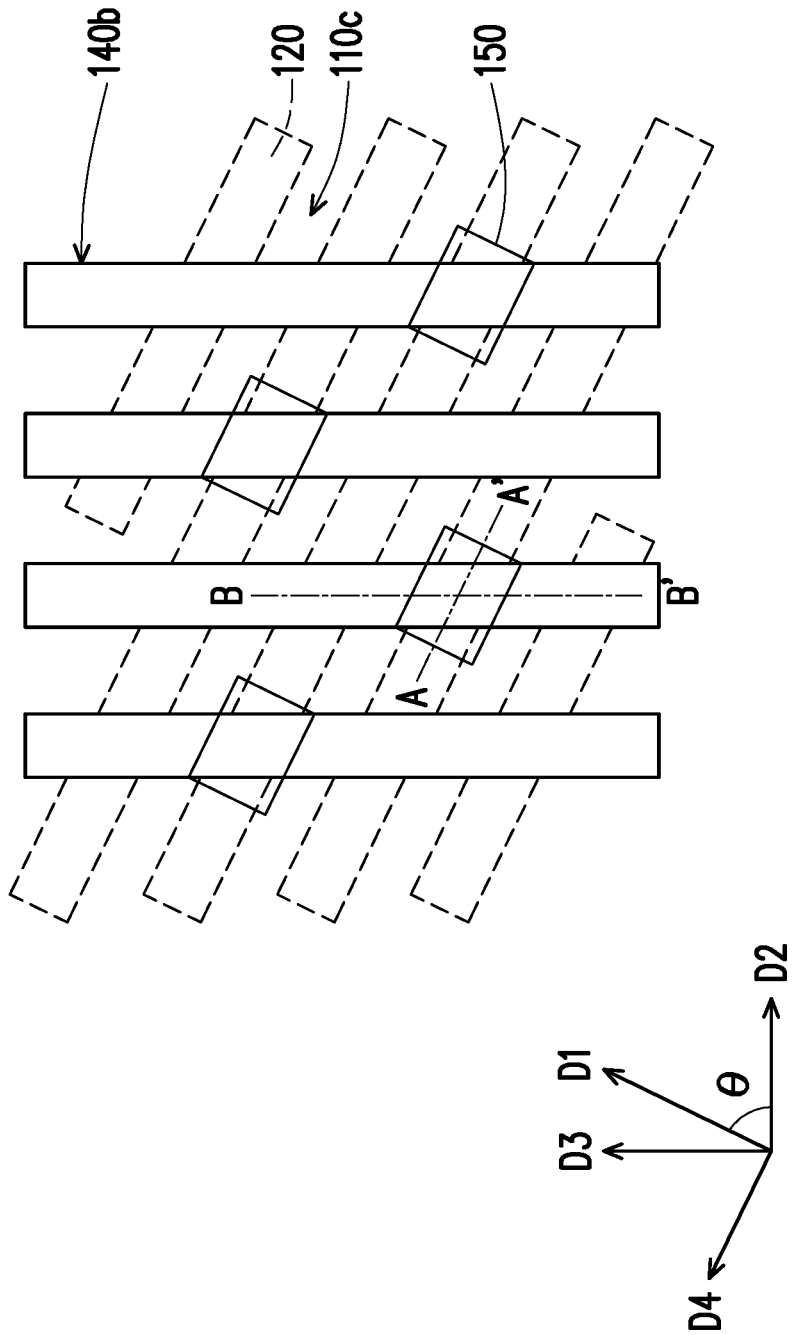
Figure 8B:
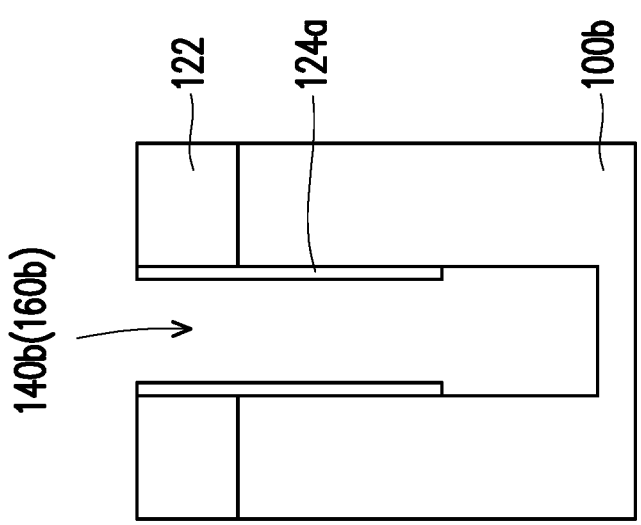
Figure 8C:
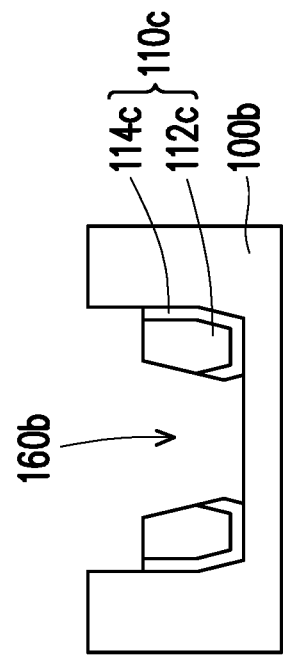
Figure 9A:
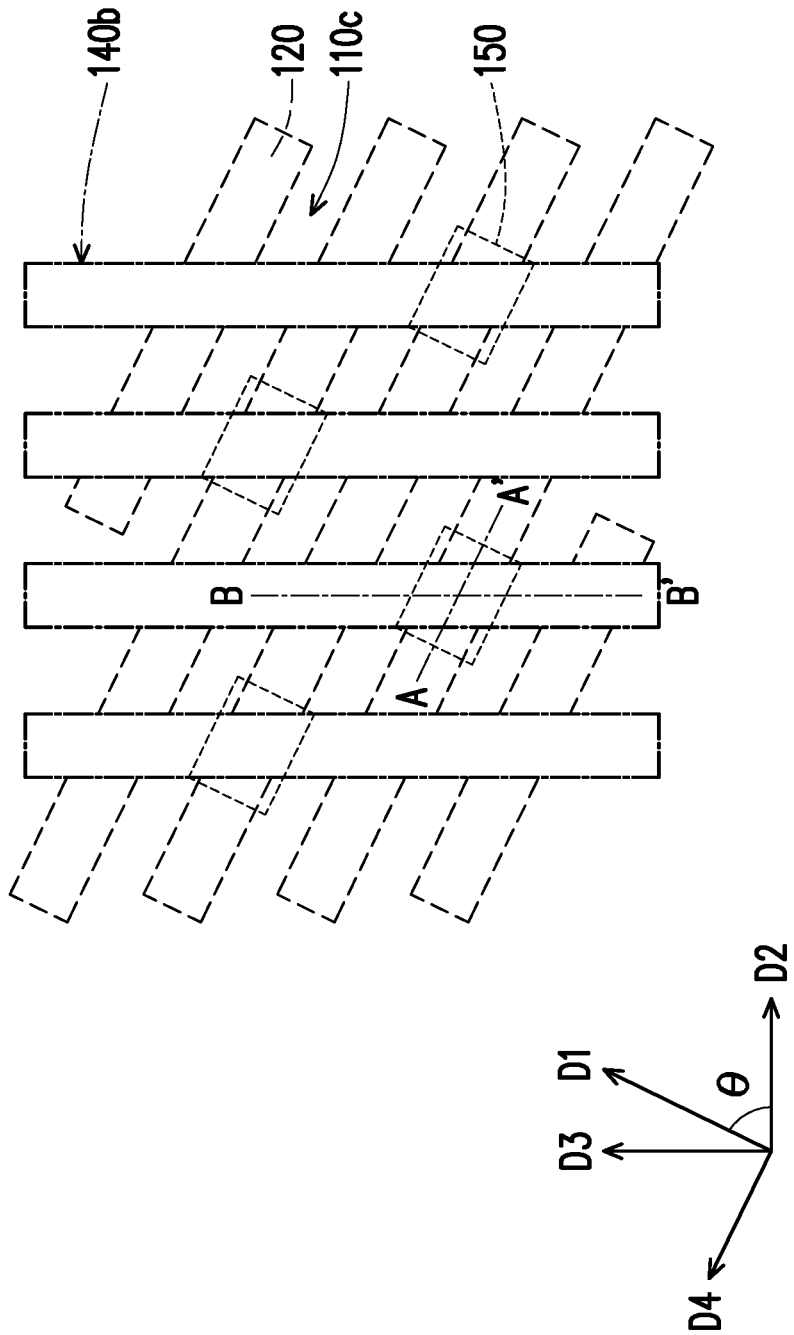
Figure 9C:
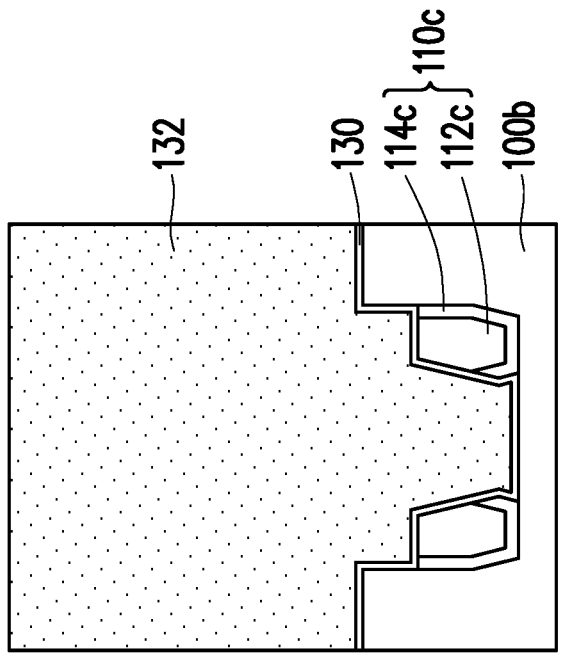
Figure 9B:
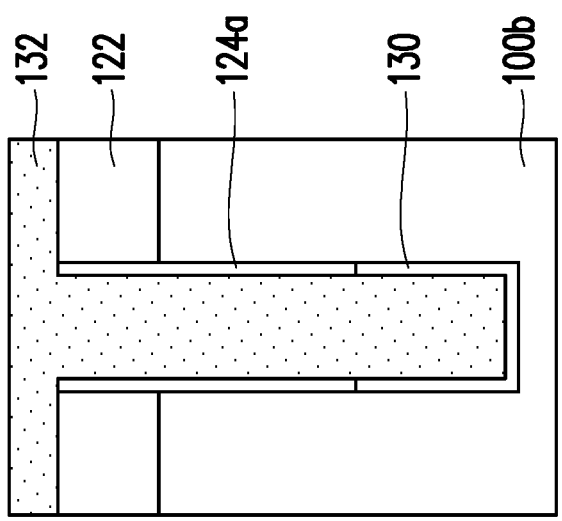
Figure 10A:
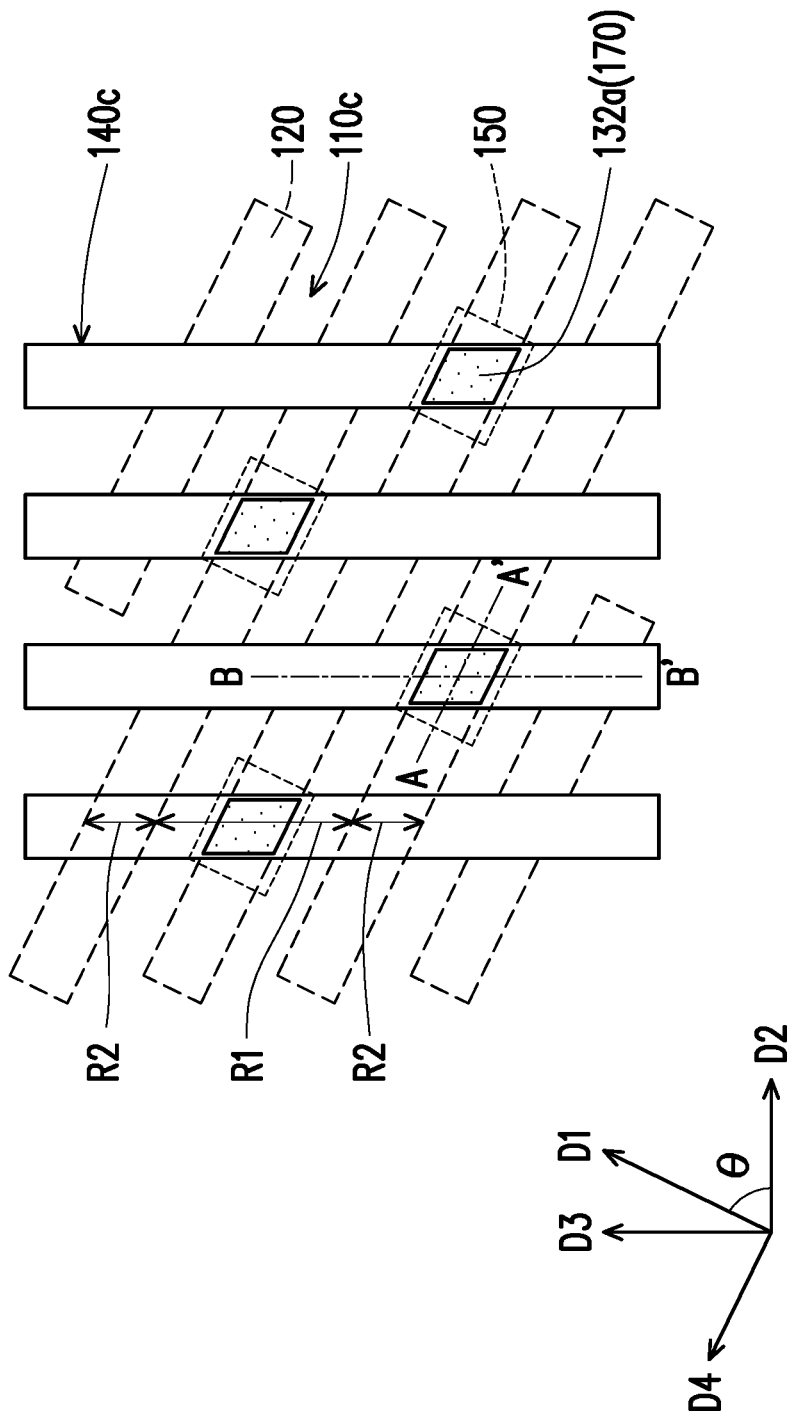

Then, referring to FIG. 7A to FIG. 8C, the photoresist layer 128 and the remaining bottom anti-reflective coating 126a are removed to continue the subsequent process of forming the isolation area 150. Referring to FIG. 8C, the bottom surface of the second opening 160b is lower than the top surface of the first isolation structure 110c.

Then, referring to FIG. 8A to FIG. 10C, a plurality of second isolation structures 170 are formed in the plurality of second openings 160b to fill the plurality of second openings 160b. In some embodiments, when the bottom surface of the second opening 160b is coplanar with the bottom surface of the first isolation structure 110c, for example, the formed bottom of the second isolation structure 170 is coplanar with the bottom of the plurality of first isolation structures 110c. In other embodiments, when the bottom surface of the second opening 160b is lower than the bottom surface of the first isolation structure 110c, for example, the formed bottom of the second isolation structure 170 is lower than the bottom of the plurality of first isolation structures 110c. In the above two cases, the second isolation structure 170 in the isolation area 150 can avoid the doubts of parasitic metal oxide semiconductor field effect transistors (MOSFET) and row hammer, and the lower the bottom of the second isolation structure 170, the better the isolation effect. The detailed steps are described below.

First, referring to FIG. 8A to FIG. 9C, a silicon oxide layer 130 is formed, wherein the silicon oxide layer 130 is conformally formed in the trench 140b to cover a portion of sidewalls and a bottom surface of the trench 140b, for example. Specifically, as shown in FIG. 8B, in the above step, the portion of the sidewalls of the trench 140b has been covered by the silicon oxide layer 124a. Thus, in this step, as shown in FIG. 9B, the silicon oxide layer 130 is formed on the exposed sidewalls and the bottom surface in the trench 140b, for example. That is to say, at this time, the sidewalls of the trench 140b is covered by the silicon oxide layer 130 and the silicon oxide layer 124a, and the exposed substrate 100b at the bottom surface of the trench 140b and the exposed surfaces of the first isolation structure 110c are covered by the silicon oxide layer 130. In the present embodiment, a method of forming the silicon oxide layer 130 is inner oxidation, for example, but the invention is not limited thereto. Then, a silicon nitride layer 132 is formed, wherein the silicon nitride layer 132 fills the trenches 140b and covers a top surface of the patterned mask 122, for example. In some embodiments, a method of forming the silicon nitride layer 132 is a chemical vapor deposition method, for example, but the invention is not limited thereto.

Then, referring to FIG. 9A to FIG. 10C, a portion of the silicon nitride layer 132 is removed to form a trench 140c. The top surface of the remaining silicon nitride layer 132a is substantially coplanar with the top surface of the silicon oxide layer 130 covering the first isolation structure 110c. Specifically, the bottom surface of the trench 140c has a plurality of concave portion R1 and a plurality of convex portion R2 alternately arranged, wherein the remaining silicon nitride layer 132a and the two first isolation structures 110c adjacent thereto are located at the concave portion R1, and the remaining substrate 100b is located at the convex portion R2. In some embodiments, a method of removing the portion of the silicon nitride layer 132 is, for example, an etch back method, such as a wet etching method, but the invention is not limited thereto. It should be noted that, the remaining silicon nitride layer 132a in the isolation area 150 constitutes the second isolation structure 170.

Then, referring to FIG. 10A to FIG. 12C, a word line structure 137 is formed in the trench 140c. Then, a third isolation structure 138 is formed to cover the word line structure 137 and fills the trench 140c. The detailed steps are described below.

Figure 11A:
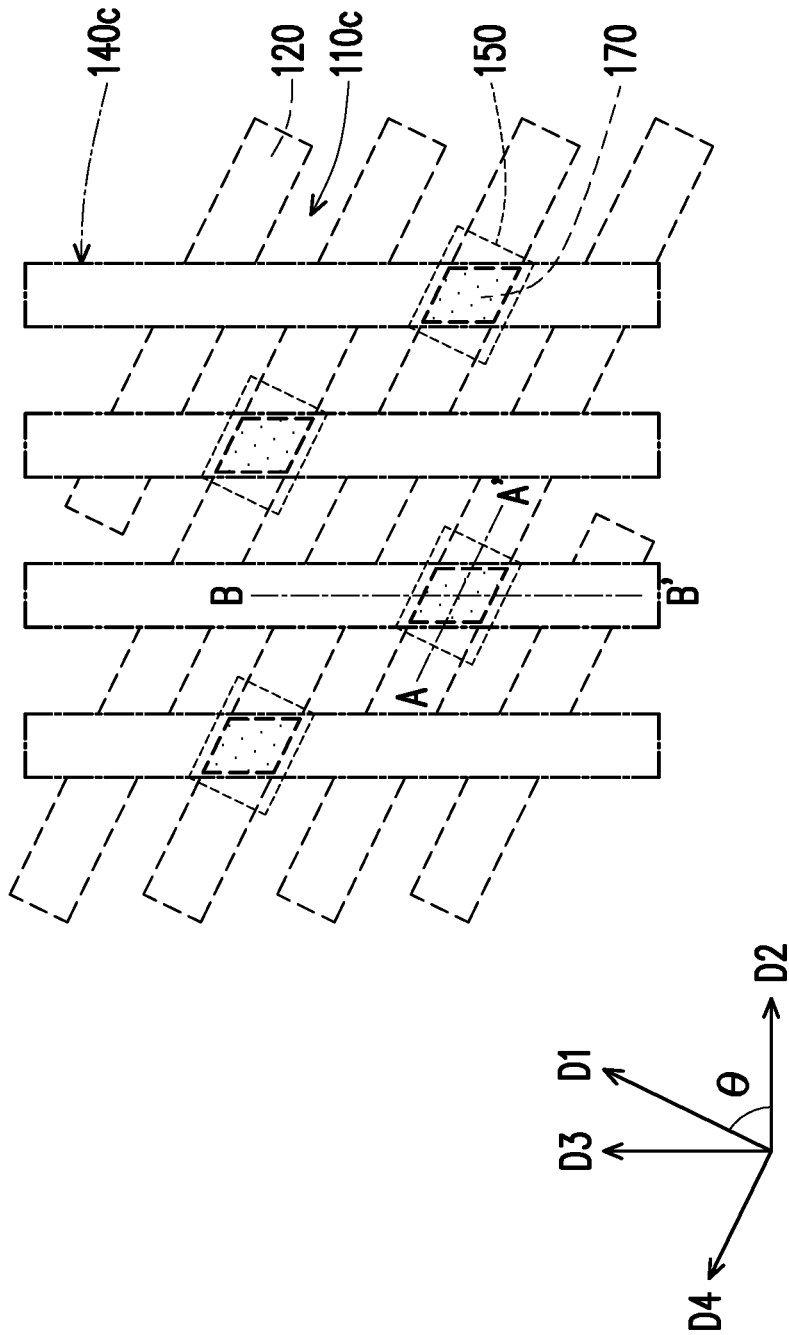
Figure 11C:
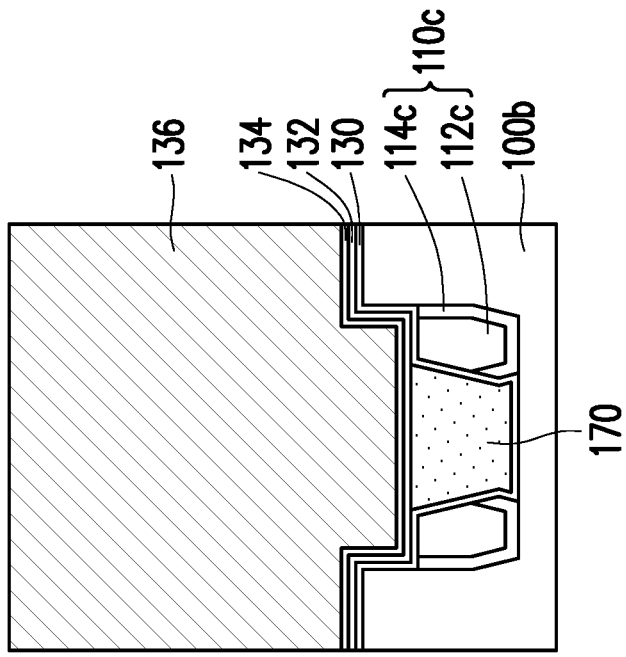
Figure 11B:
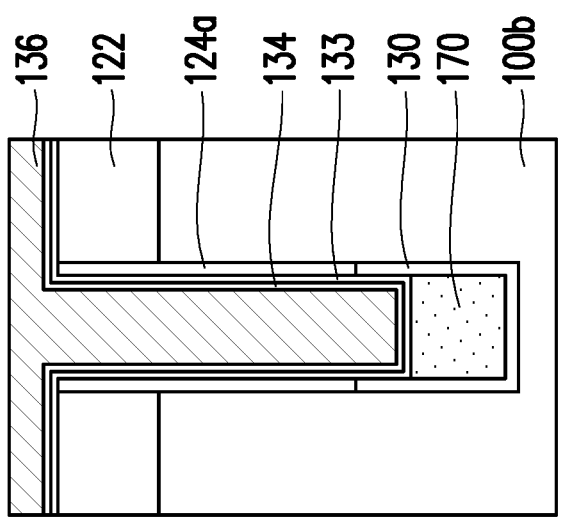

First, referring to FIG. 10A to FIG. 11C, the trench 140c is pre-cleaned first to remove impurities on the surface of the trench 140c. In some embodiments, the trench 140c is pre-cleaned using dilute hydrofluoric acid (DHF), for example, but the invention is not limited thereto. Then, a gate oxide layer 133 is formed. As shown in FIG. 11B, in the present embodiment, the gate oxide layer 133 is conformally formed on a bottom surface and sidewalls of the trench 140c, for example. That is to say, as shown in FIG. 11C, at the concave portion R1 of the bottom surface of the trench 140c, the gate oxide layer 133 covers the top surface of the second isolation structure 170 and covers the silicon oxide layer 130 on the two adjacent first isolation structures 110c, but the invention is not limited thereto. Then, a liner layer 134 is formed. In the present embodiment, the liner layer 134 conformally covers the gate oxide layer 133 as a buffer layer, for example. In some embodiments, a material of the liner layer 134 includes titanium nitride, tungsten nitride, tantalum nitride, or a combination thereof, for example. Then, a conductive material layer 136 is formed to fill the trench 140c. In some embodiments, the conductive material layer 136 is a metal material, a barrier metal material, or a combination thereof, for example. In the present embodiment, the material of the conductive material layer 136 is tungsten, for example, but the invention is not limited thereto. In some embodiments, a method of forming the liner layer 134 and the conductive material layer 136 includes a sputtering method, an electroplating method, or an electron beam evaporation method, for example, but the invention is not limited thereto.

Then, referring to FIG. 11A to FIG. 12C, a portion of the conductive material layer 136 and a portion of the liner layer 134 are removed to form the word line structure 137. That is to say, the remaining conductive material layer 136a and the liner layer 134a constitute the word line structure 137. In some embodiments, a method of removing the portion of the conductive material layer 136 and the portion of the liner layer 134 is an etch back method, for example. In some embodiments, a top surface of the word line structure 137 is lower than a top surface of the substrate 100b, for example. Then, a third isolation structure 138 is formed to cover the word line structure 137 and fills the trench. In some embodiments, a method of forming the third isolation structure 138 is forming a dielectric material layer first to fill the trench and cover top surfaces of the word line structure 137 and the patterned mask 122, for example. At last, a portion of the dielectric material layer and a portion of the patterned mask 122 are removed. The remaining dielectric material layer is the third isolation structure 138. In some embodiments, a top surface of a remaining patterned mask 122a is coplanar with a top surface of the third isolation structure 138, but the invention is not limited thereto. At this point, subsequent semiconductor component processes, such as capacitor contact windows, bit lines, and the like, can be continued. For instance, as shown in FIG. 12A, the solid line box in the figure may be the predetermined area for formation of a capacitor contact window 180, for example, and a plurality of strip patterns extended along the second direction D2 and arranged along the third direction D3 in the figure may be the predetermined area for formation of a bit line structure 190, for example, but the invention is not limited thereto.

It should be noted that, in the embodiment of the present invention, the isolation area 150 may include a three-layer structure of the second isolation structure 170, the word line structure 137, and the third isolation structure 138 from bottom to top. In the process of defining the word line structure 137, the positions of the second isolation structure 170 and the third isolation structure 138 can be simultaneously defined, wherein a top edge of the third isolation structure 138 in the isolation area 150 is defined by the word line structure 137. Further, in the embodiment of the present invention, the photomask only needs to be opened once for defining the word line structure 137. Thus, compared to the conventional process, it is not necessary to separately define the positions of the word line structure 137, the second isolation structure 170, and the third isolation structure 138 in the present embodiment. The problem of overlay shift between the second isolation structure 170 and the third isolation structure 138 in the isolation area 150 and the word line structure 137 can be avoided. Thereby, the problem of abnormal refresh of the dynamic random access memory can be avoided. In addition, the dynamic random access memory prepared according to the embodiment of the invention may have a narrower isolation area 150 while maintaining a wider capacitor contact window 180, so as to achieve a lower capacitor contact window impedance and a higher memory cell Tr channel starting current. Thereby, the dynamic random access memory may have better data read and write performance.

Figure 12A:
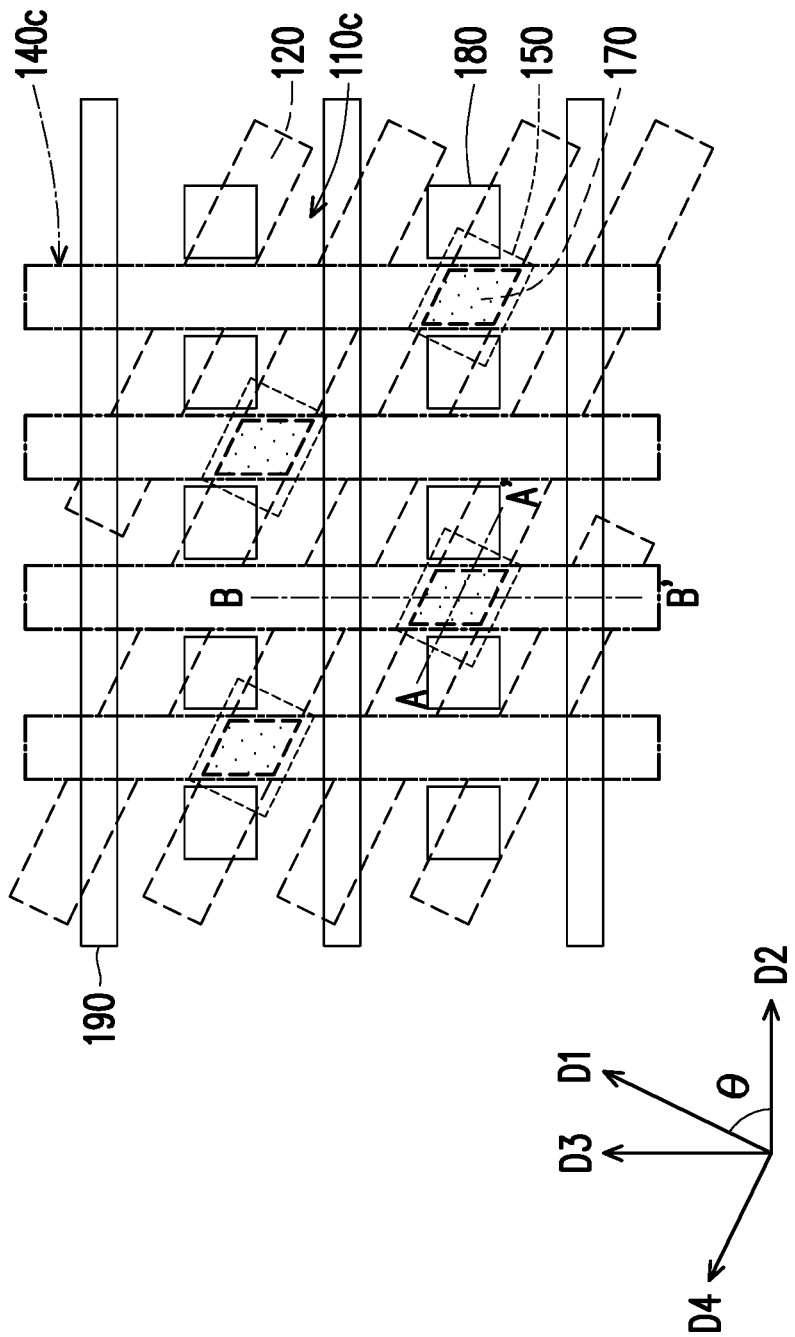
Figures 12B, 12C:
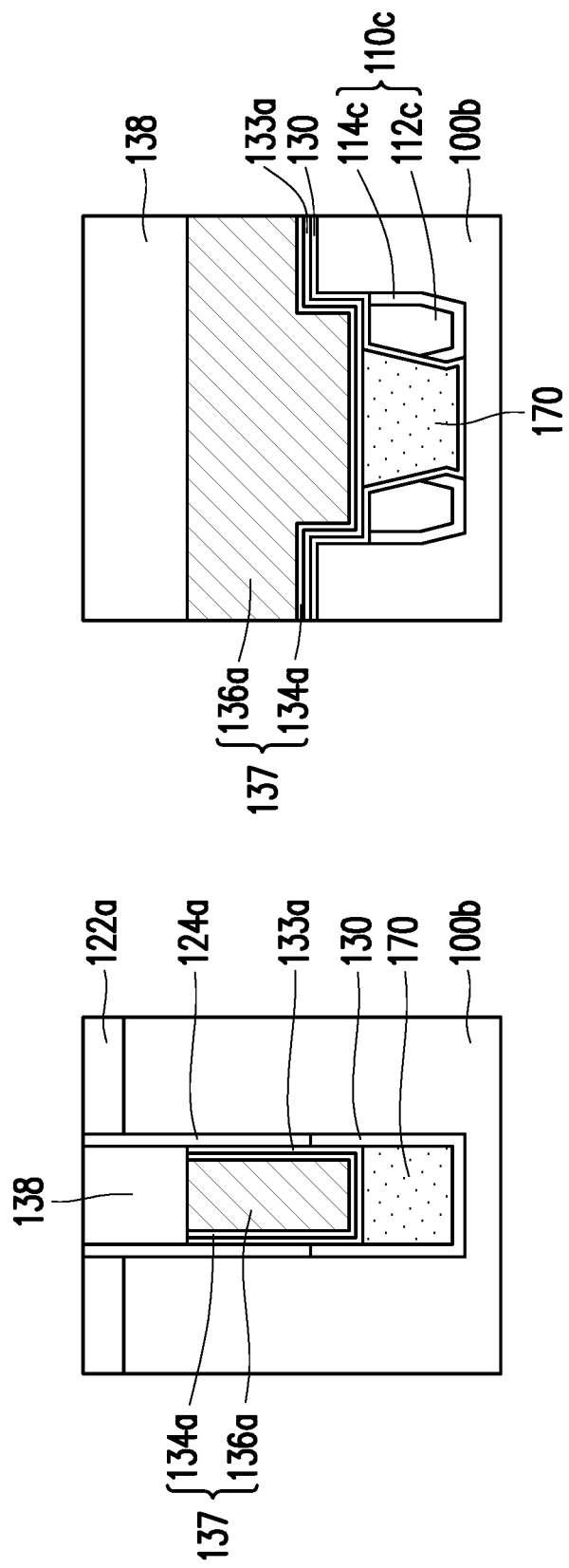

In addition, the embodiment of the invention also provides a dynamic random access memory. Referring to FIG. 12A to FIG. 12C, the dynamic random access memory includes the substrate 100b, the plurality of first isolation structures 110c, the plurality of word line structures 137, the plurality of second isolation structures 170, and the plurality of third isolation structures 138. The plurality of first isolation structures 110c are located in the substrate 100b to define the plurality of active areas 120 arranged along the first direction D1, wherein the plurality of active areas 120 and the plurality of first isolation structures 100c are alternately arranged along the first direction D1. The plurality of word line structures 137 pass through the plurality of active areas 120 and the plurality of first isolation structures 110c, and the plurality of word line structures 137 are arranged along the second direction D2 and extended along the third direction D3, wherein the second direction D2 is perpendicular to the third direction D3, and the first direction D1 is non-orthogonal to and intersects the second direction D2 by an angle. The plurality of second isolation structures 170 are located in the substrate 100b where the plurality of word line structures 137 are interleaved with the plurality of active areas 120 and located between the two adjacent first isolation structures 110c. The plurality of third isolation structures 138 cover the plurality of word line structures 137.

In some embodiments, the first isolation structures 110c and the second isolation structures 170 have at least one oxide layer therebetween. In some embodiments, the material of the oxide layer includes silicon oxide, for example, but the invention is not limited thereto. Referring to FIG. 12C, in the present embodiment, an upper half of the oxide layer between the first isolation structures 110c and the second isolation structures 170 has the silicon oxide layer 130, and a lower half of the oxide layer between the first isolation structures 110c and the second isolation structures 170 has the silicon oxide layer 130 and the silicon oxide layer 114c, but the invention is not limited thereto. In other embodiments, the oxide layer between the first isolation structures 110c and the second isolation structures 170 may only have the silicon oxide layer 130. In other embodiments, the oxide layer between the first isolation structures 110c and the second isolation structures 170 may have the silicon oxide layer 130 and the silicon oxide layer 114c simultaneously, as long as the first isolation structures 110c and the second isolation structures 170 have at least one oxide layer therebetween.

In some embodiments, the oxide layer on the sidewalls of the word line structure 137 includes the silicon oxide layer 124a and the silicon oxide layer 130, wherein the portion on the top surface of the convex portion R2 at the bottom surface of the trench 140c is the silicon oxide layer 124a, and the portion below the top surface of the convex portion R2 at the bottom surface of the trench 140c is the silicon oxide layer 130. In addition, the oxide layer on the sidewalls and the bottom surface of the second isolation structure 170 is the silicon oxide layer 130. In some embodiments, the thickness of the silicon oxide layer 130 is greater than the thickness of the gate oxide layer 133a, for example, but the invention is not limited thereto.

In summary, in the dynamic random access memory of the invention, in the process of defining the word line structure, the positions of the second isolation structure and the third isolation structure in the isolation area can be simultaneously defined. Thus, the problem of overlay shift between the second isolation structure and the third isolation structure in the isolation area and the word line structure can be avoided. Thereby, the problem of abnormal refresh of the dynamic random access memory can be avoided. At the same time, the dynamic random access memory prepared by the process may have a narrower isolation area while maintaining a wider capacitor contact window, so as to achieve a lower capacitor contact window impedance and a higher memory cell Tr channel starting current. Thereby, the dynamic random access memory may have better data read and write performance. On the other hand, since the number of photomasks required for the process is reduced, the cost of the overall process can also be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A dynamic random access memory, comprising:
    a substrate;
    a plurality of first isolation structures, located in the substrate to define a plurality of active areas arranged along a first direction, wherein the plurality of active areas and the plurality of first isolation structures are alternately arranged along the first direction;
    a plurality of word line structures, passing through the plurality of active areas and the plurality of first isolation structures, the plurality of word line structures being arranged along a second direction and extended along a third direction, wherein the second direction is perpendicular to the third direction, and the first direction intersects the second direction by an angle;
    a plurality of second isolation structures, located in the substrate where the plurality of word line structures are interleaved with the plurality of active areas and located between two adjacent first isolation structures; and a plurality of third isolation structures, covering the plurality of word line structures, wherein regions of the plurality of word line structures extending on the plurality of the first isolation structures and the plurality of second isolation structures are thicker along a fourth direction perpendicular to the second direction and the third direction than regions of the plurality of word line structures extending on the plurality of active areas.

2. The dynamic random access memory according to claim 1, wherein the plurality of first isolation structures and the plurality of second isolation structures have at least one oxide layer therebetween.

3. The dynamic random access memory according to claim 2, wherein a material of the at least one oxide layer comprises silicon oxide.

4. The dynamic random access memory according to claim 1, wherein a bottom of the plurality of second isolation structures is coplanar with a bottom of the plurality of first isolation structures.

5. The dynamic random access memory according to claim 1, wherein a bottom of the plurality of second isolation structures is lower than a bottom of the plurality of first isolation structures.

6. The dynamic random access memory according to claim 1, wherein a width of the second isolation structures in the third direction is greater than or equal to a distance between the two adjacent first isolation structures.

7. The dynamic random access memory according to claim 1, wherein the plurality of word line structures further comprises a gate oxide layer, and the gate oxide layer is located between the plurality of word line structures and the substrate, the plurality of first isolation structures, and the plurality of second isolation structures.

8. The dynamic random access memory according to claim 7, further comprising an oxide layer, located between the plurality of second isolation structures and the substrate, wherein a thickness of the oxide layer is greater than a thickness of the gate oxide layer.

9. A method of fabricating a dynamic random access memory, comprising:
   forming a plurality of first isolation structures in a substrate to define a plurality of active areas arranged along a first direction, wherein the plurality of active areas and the plurality of first isolation structures are alternately arranged along the first direction;
   removing a portion of the plurality of first isolation structures and a portion of the substrate of the plurality of active areas to form a plurality of trenches arranged along a second direction and extended along a third direction, wherein the second direction is perpendicular to the third direction, and the first direction intersects the second direction by an angle;
   removing another portion of the plurality of first isolation structures to form a plurality of first openings in the plurality of trenches;
   removing another portion of the substrate where the plurality of active areas are interleaved with the plurality of trenches to form a plurality of second openings, wherein the second openings are located between two adjacent first isolation structures, and a bottom surface of the plurality of second openings is lower than a bottom surface of the plurality of first openings;
   forming a plurality of second isolation structures in the plurality of second openings to fill the plurality of second openings;
   forming a plurality of word line structures in the plurality of trenches wherein regions of the plurality of word line structures extending on the plurality of the first isolation structures and the plurality of second isolation structures are thicker along a fourth direction perpendicular to the second direction and the third direction than regions of the plurality of word line structure extending on the plurality of active areas; and
   forming a plurality of third isolation structures to cover the plurality of word line structures and fill the plurality of trenches.

10. The method of fabricating the dynamic random access memory according to claim 9, wherein the plurality of first isolation structures and the plurality of second isolation structures have at least one oxide layer therebetween.

11. The method of fabricating the dynamic random access memory according to claim 10, wherein a material of the at least one oxide layer comprises silicon oxide.

12. The method of fabricating the dynamic random access memory according to claim 9, wherein a bottom of the plurality of second isolation structures is coplanar with a bottom of the plurality of first isolation structures.

13. The method of fabricating the dynamic random access memory according to claim 9, wherein a bottom of the plurality of second isolation structures is lower than a bottom of the plurality of first isolation structures.

14. The method of fabricating the dynamic random access memory according to claim 9, wherein a width of the second isolation structures in the third direction is greater than or equal to a distance between the two adjacent first isolation structures.

15. The method of fabricating the dynamic random access memory according to claim 9, wherein a method of forming the plurality of second openings further comprises:
   forming a bottom anti-reflective coating to fill the trenches; and
   removing a portion of the bottom anti-reflective coating and the other portion of the substrate to form the plurality of second openings.

16. The dynamic random access memory according to claim 1, wherein the at least one oxide layer includes regions extending on top surfaces of the plurality of first isolation structures and other regions extending below the plurality of second isolation structures, on bottom surfaces of the plurality of second isolation structures.

17. The dynamic random access memory according to claim 16, wherein top surfaces of the plurality of second isolation structures are substantially coplanar with top surfaces of the regions of the at least one oxide layer extending on the top surfaces of the first isolation structures.

* * * * *